United States Patent
Lindner et al.

(10) Patent No.: US 9,771,223 B2
(45) Date of Patent: Sep. 26, 2017

(54) DEVICE AND METHOD FOR PROCESSING OF WAFERS

(71) Applicant: EV Group GmbH, St. Florian am Inn (AT)

(72) Inventors: Friedrich Paul Lindner, Scharding (AT); Peter Oliver Hangweier, Pram (AT)

(73) Assignee: EV Group GmbH, St. Florian am Inn (AT)

( * ) Notice: Subject to any disclaimer, the term of this patent is extended or adjusted under 35 U.S.C. 154(b) by 818 days.

(21) Appl. No.: 13/948,478

(22) Filed: Jul. 23, 2013

(65) Prior Publication Data

US 2013/0309046 A1    Nov. 21, 2013

Related U.S. Application Data

(62) Division of application No. 13/878,570, filed as application No. PCT/EP2011/067405 on Oct. 5, 2011.

(30) Foreign Application Priority Data

Oct. 15, 2010 (DE) .................. 10 2010 048 043

(51) Int. Cl.
  *H01L 21/02* (2006.01)
  *B65G 47/00* (2006.01)
  *H01L 21/67* (2006.01)

(52) U.S. Cl.
  CPC ........ *B65G 47/00* (2013.01); *H01L 21/02002* (2013.01); *H01L 21/67173* (2013.01); *H01L 21/67201* (2013.01); *Y10T 156/10* (2015.01)

(58) Field of Classification Search
  CPC ......... H01L 21/67201; H01L 21/67742; H01L 21/67772
  USPC .................................................. 414/217, 939
  See application file for complete search history.

(56) References Cited

U.S. PATENT DOCUMENTS

| | | | |
|---|---|---|---|
| 4,388,034 A | 6/1983 | Takahashi | 414/331 |
| 4,752,180 A * | 6/1988 | Yoshikawa | H01L 21/187 257/E21.088 |
| 4,764,076 A | 8/1988 | Layman et al. | 414/217 |
| 4,825,808 A | 5/1989 | Takahashi | 118/715 |
| 5,044,871 A | 9/1991 | Davis et al. | 414/786 |

(Continued)

FOREIGN PATENT DOCUMENTS

| CN | 101965241 A | 2/2011 | B23K 20/00 |
|---|---|---|---|
| EP | 0 488 267 A2 | 6/1992 | |

(Continued)

OTHER PUBLICATIONS

International Search Report for International Application No. PCT/EP2011/067405, Nov. 15, 2011.

(Continued)

*Primary Examiner* — Kaitlin Joerger
(74) *Attorney, Agent, or Firm* — Kusner & Jaffe

(57) ABSTRACT

The invention relates to a device for processing of substrates, especially wafers, with at least one pretreatment module, at least one aftertreatment module and at least one primary treatment module, and the pretreatment module and the aftertreatment module can be switched as a lock for the primary treatment module, and a corresponding method for processing of substrates, especially wafers.

15 Claims, 4 Drawing Sheets

(56) References Cited

U.S. PATENT DOCUMENTS

| | | | |
|---|---|---|---|
| 5,395,474 A | 3/1995 | Suzuki et al. | 156/345 |
| 5,455,082 A * | 10/1995 | Saito | C23C 14/566 |
| | | | 427/248.1 |
| 5,795,399 A | 8/1998 | Hasegawa et al. | 134/1.3 |
| 5,848,868 A | 12/1998 | Suzuki et al. | 414/416 |
| 5,855,681 A | 1/1999 | Maydan | 118/719 |
| 5,873,942 A | 2/1999 | Park | 118/715 |
| 5,876,497 A | 3/1999 | Atoji | 117/85 |
| 5,900,105 A | 5/1999 | Toshima | 118/719 |
| 6,178,361 B1 | 1/2001 | George et al. | 700/213 |
| 7,226,512 B2 * | 6/2007 | Fury | H01L 21/67017 |
| | | | 134/21 |
| 7,559,730 B2 | 7/2009 | Song | 414/217 |
| 7,972,961 B2 | 7/2011 | Suglyama | 118/719 |
| 8,244,399 B2 * | 8/2012 | Maeda | H01L 21/67092 |
| | | | 156/60 |
| 8,272,825 B2 | 9/2012 | Hofmeister | 414/217 |
| 8,656,858 B2 | 2/2014 | Schneider | 118/423 |
| 9,138,980 B2 * | 9/2015 | Broekaart | H01L 21/67092 |
| 2002/0005168 A1 | 1/2002 | Kraus | 118/715 |
| 2002/0061245 A1 | 5/2002 | Hasegawa et al. | 414/217 |
| 2003/0003767 A1 * | 1/2003 | Kim et al. | 438/763 |
| 2004/0023466 A1 * | 2/2004 | Yamauchi | H01L 21/67294 |
| | | | 438/401 |
| 2005/0118002 A1 | 6/2005 | Kasumi | 414/221 |
| 2007/0051462 A1 * | 3/2007 | Nakayama | B29C 66/001 |
| | | | 156/285 |
| 2008/0053619 A1 | 3/2008 | Nakayama et al. | 156/382 |
| 2009/0028672 A1 | 1/2009 | Yamawaku et al. | 414/217 |
| 2010/0003110 A1 * | 1/2010 | Yokota | B32B 38/18 |
| | | | 414/217.1 |
| 2010/0014945 A1 | 1/2010 | Takizawa et al. | 414/217 |
| 2010/0203676 A1 * | 8/2010 | Theuss | H01L 21/561 |
| | | | 438/109 |
| 2010/0215460 A1 | 8/2010 | Watanabe et al. | 414/217 |
| 2010/0266373 A1 * | 10/2010 | George | B32B 43/006 |
| | | | 414/225.01 |
| 2011/0001953 A1 | 1/2011 | Ono | 355/72 |
| 2011/0209832 A1 | 9/2011 | Tawara | 156/538 |
| 2012/0067525 A1 | 3/2012 | Nakayama et al. | 156/382 |
| 2013/0167369 A1 * | 7/2013 | Oh | H01L 21/67144 |
| | | | 29/740 |
| 2013/0251494 A1 * | 9/2013 | Okamoto | H01L 21/67253 |
| | | | 414/788.1 |
| 2013/0292062 A1 * | 11/2013 | Iwashita | H01L 21/67092 |
| | | | 156/750 |

FOREIGN PATENT DOCUMENTS

| | | | |
|---|---|---|---|
| EP | 0 935 279 A2 | 8/1999 | H01L 21/00 |
| JP | H04349929 A | 12/1992 | B01J 3/00 |
| JP | H0669140 A | 3/1994 | C23C 16/46 |
| JP | H09223783 A | 8/1997 | H01L 21/02 |
| JP | 2001-267237 A | 9/2001 | B65G 49/00 |
| JP | 2001-351892 A | 12/2001 | H01L 21/304 |
| JP | 2004-157452 A | 6/2004 | B05D 7/24 |
| JP | 2007-065521 A | 3/2007 | G02F 1/13 |
| JP | 2008-10670 A | 1/2008 | H01L 21/677 |
| JP | 2010212638 | 9/2010 | H01L 21/02 |
| WO | WO2010/058481 | 5/2010 | |
| WO | WO 2010/058481 A1 | 5/2010 | B30B 15/02 |

OTHER PUBLICATIONS

Japanese Office Action issued in connection with corresponding Japanese Patent Application No. 2013-533151, dated Jun. 13, 2016.
Office Action (dated Sep. 18, 2014) issued in connection with corresponding European Patent Application No. 11 764 566.3.
Office Action received in corresponding Japanese Patent Application No. 2013-153406, Apr. 7, 2014.
Office Action issued in connection with European Patent Application No. 13174234.8, dated Oct. 6, 2016.

* cited by examiner

DEVICE AND METHOD FOR PROCESSING OF WAFERS

RELATED APPLICATIONS

The present application is a divisional of U.S. application Ser. No. 13/878,570, filed Apr. 10, 2013, which is a U.S. National Stage Application of International Application No. PCT/EP11/67405, filed Oct. 5, 2011, which claims priority from German Patent Application No. 10 2010 048 043.6, filed Oct. 15, 2010, said patent applications hereby fully incorporated herein by reference.

FIELD OF THE INVENTION

The invention relates to a device for processing of substrates or substrate pairs, especially wafers as wafer pairs.

BACKGROUND OF THE INVENTION

Process systems or process devices of semiconductor technology are generally of modular structure. They conventionally consist of different chambers in which various process steps are carried out. Thus, for example for pretreatment of wafers, process steps such as wet cleaning, plasma treatment, etching or heating can be used, while for primary treatment of a wafer, bonding, lacquering, imprinting, embossing and exposure are possible. In known process systems the wafers or wafer stacks are transported with cassettes between the process systems or modules of process systems.

During transport, the contamination, damage, fouling or oxidation and thus influencing of other process steps can occur.

Contamination of the primary treatment chambers between treatments of successive wafers, therefore in loading and unloading of wafers, is also a problem.

Furthermore it is critical with respect to time that in the primary treatment large pressure differences from atmospheric pressure as far as very low pressures of $10^{-6}$ bar or less must be overcome.

SUMMARY OF THE INVENTION

The object of this invention is therefore to optimize the processing of substrates both in terms of the sequence, and also to avoid contamination, damage, fouling or oxidation as much as possible.

This object is achieved with the features of the independent claims. Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The invention is based on the idea of coupling a primary treatment module to at least one pretreatment module and at least one aftertreatment module such that at least one of the pretreatment modules and at least one of the aftertreatment modules and/or the primary treatment module each act as vacuum-tight locks for an adjacent pretreatment module, primary treatment module or aftertreatment module. At the same time, according to the invention in one embodiment of the invention it is provided that at least one of the pretreatment modules and/or the primary treatment module and/or at least one of the aftertreatment modules can be especially exposed to pressure, a vacuum, and/or can be temperature-treated, especially can be heated independently or regardless of an adjacent module.

In this way, in spite of a flexible structure of the process system according to the device as claimed in the invention a time-optimized, even parallel processing of several substrates is provided within the device as claimed in the invention, in which based on the lock-like coupling of the individual process modules contamination, damage, fouling or oxidation by decoupling of the substrates from external effects, especially in the loading and unloading of the individual modules, is resolved.

It is especially advantageous if the primary treatment module can be loaded and unloaded exclusively via locks or a positing system. This is achieved as claimed in the invention by there being both a pretreatment module which is coupled in the manner of a lock to the primary treatment module and also an aftertreatment module which is coupled in the manner of a lock to the primary treatment module. By this measure the generally especially critical primary treatment of the substrates or wafers which occurs under often extreme conditions does not take place at any instant of the processing nor during the loading and unloading of the primary treatment module with contact with the environment. The primary treatment module is accordingly completely decoupled from the environment so that contamination, damage, fouling or oxidation during the primary treatment of the substrates is essentially precluded. Furthermore, there is the advantage that the steps preparatory and subsequent to primary treatment can be moved into the pretreatment module and the aftertreatment module, especially at least partial exposure to pressure and/or temperature. In the primary treatment module as a result of this only a lower pressure difference and/or temperature difference than from the ambient/atmospheric pressure $p_{ATM}$ need be overcome.

According to one advantageous embodiment of the invention, it is provided that the primary treatment chamber can be switched as a lock in the loading and unloading of the substrates. Thus, when the primary treatment chamber is being loaded, at the same time aftertreatment of the substrate which has been worked beforehand in the primary treatment chamber can take place. When the primary treatment chamber is being unloaded, conversely at the same time pretreatment of the next substrate which is to be worked in the primary treatment chamber can take place in the pretreatment chamber.

In another advantageous embodiment, it is provided that the pretreatment chamber and/or the primary treatment chamber and/or the aftertreatment chamber can be heated especially separately by means of a heating apparatus. It is especially advantageous here if the pretreatment chamber and/or the primary treatment chamber and/or the aftertreatment chamber are completely heat-insulated. In this way exact temperature control is possible with heat loss as low as possible.

To the extent other correspondingly made pretreatment modules can be connected upstream to the pretreatment module as locks and/or other correspondingly made aftertreatment modules can be connected downstream of the aftertreatment module as locks, the method sequence can be further subdivided so that optimization of the passage times in the process sequence arises. Here it is conceivable as claimed in the invention that at the same time several pretreatment modules are directly coupled to one pretreatment module via lock doors. In this way time-intensive pretreatment steps can proceed parallel and accordingly staggered in time in the upstream pretreatment modules. This applies analogously to the corresponding aftertreatment modules.

By the locks being made as pressure locks and/or temperature locks it is possible as claimed in the invention to control the pressure and/or the temperature by corresponding switching of the pretreatment modules and/or the aftertreatment modules.

For loading and unloading, as claimed in the invention there is a loading and unloading apparatus, especially at least one robot arm. The latter is used for loading and unloading of the substrates into/out of the primary treatment chamber and/or the pretreatment chamber and/or the aftertreatment chamber, and for parallel handling there can be several substrates/wafers in the process sequence, as claimed in the invention several robot arms. Thus for example in each pretreatment chamber and/or each aftertreatment chamber there can be exactly one robot arm which can engage the respectively adjacent pretreatment chamber and/or primary treatment chamber for loading and unloading of the respectively adjacent chambers when the respective lock door is opened.

According to one especially advantageous embodiment of the invention it is provided that the primary treatment chamber can be loaded at the same time from the pretreatment chamber and can be unloaded into the aftertreatment chamber and/or the pretreatment chamber and the aftertreatment chamber can be loaded at the same time via the first lock door and unloaded via the second lock door.

Other advantages, features and details of the invention will become apparent from the following description of preferred exemplary embodiments and using the drawings.

BRIEF DESCRIPTION OF THE DRAWINGS

The same reference numbers for corresponding components are provided in the figures.

DETAILED DESCRIPTION OF THE INVENTION

Figure 1A:
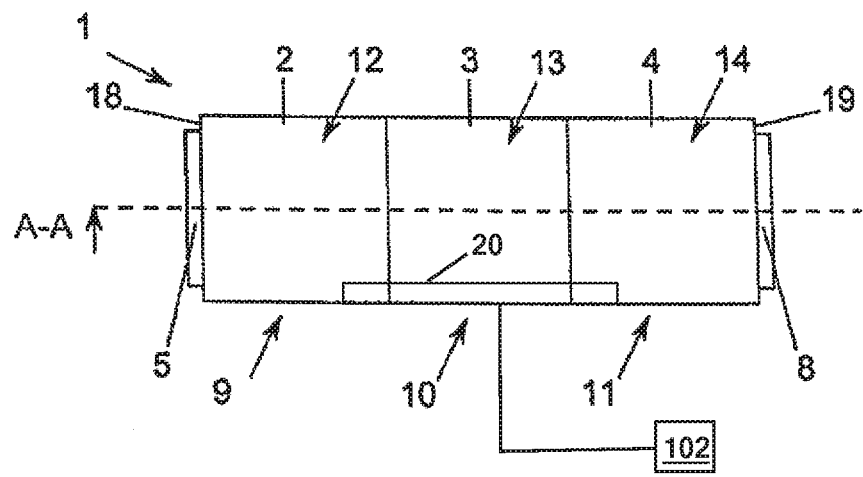
FIG. 1a shows a schematic plan view of a device as claimed in the invention with a pretreatment module, a primary treatment module and an aftertreatment module.

In the embodiment of a device 1 as claimed in the invention shown in FIG. 1 a pretreatment module 9, a primary treatment module 10 and an aftertreatment module 11 are arranged linearly in a row.

The pretreatment module 9 consists of a pretreatment chamber 2 which can be exposed to a vacuum and which surrounds a pretreatment space 12. A pressurization apparatus which is not shown is connected to the pretreatment chamber 2 and can be controlled by a central control apparatus 102 in order to be able to control the pressure in the pretreatment space 12 with the pretreatment chamber 2 closed. Via a temperature exposure apparatus 20, the pretreatment space 12 can be heated and/or cooled, the temperature exposure apparatus 20 being controllable by the central control apparatus 102.

Figure 4:
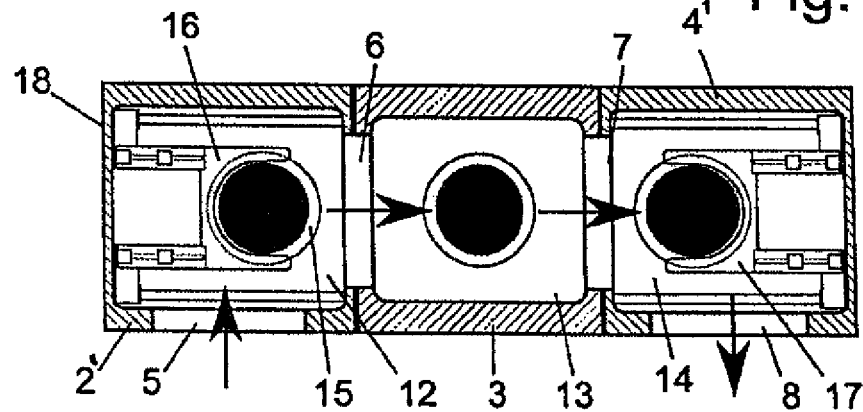
FIG. 4 shows a sectional view of the device as claimed in the invention with a pretreatment module, a primary treatment module and an aftertreatment module.

To load the pretreatment module 9 with one (or more) wafers 15, according to FIG. 4 there is a first robot arm 16. The latter, controlled from the central control apparatus 102, can be routed through a first lock door 5 when the first lock door 5 is opened. Opening and closing of the first lock door 5 are likewise controlled by the central control apparatus 102.

Figure 1B:
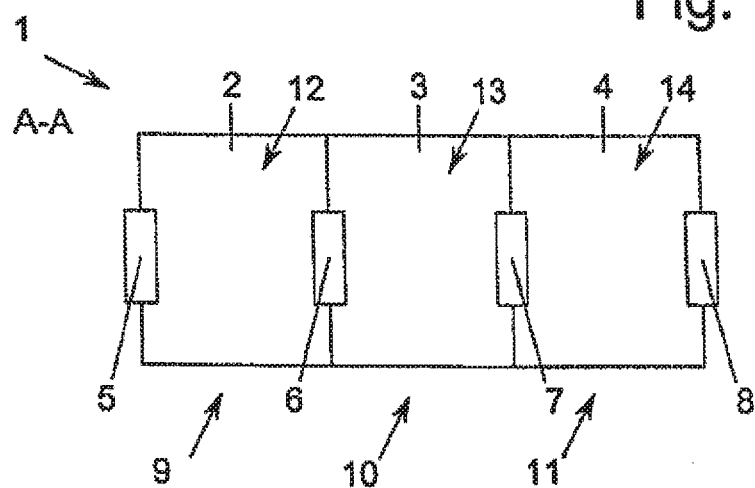
FIG. 1b shows a schematic sectional view of the device as claimed in the invention according to cutting line A-A from FIG. 1a, FIG. 2a shows a schematic plan view of a second embodiment of the device as claimed in the invention with a pretreatment module, a primary treatment module and an aftertreatment module.

The first lock door 5 in the embodiment according to FIGS. 1a and 1b is located on a first face side 18 of the device 1. The first lock door 5 can be closed pressure-tight and has heat insulation so that the pretreatment space 12 in the closed state of the first lock door 5 can be pressurized.

Furthermore, the pretreatment chamber 2 opposite the first lock door 5 jointly with a primary treatment chamber 3 of the primary treatment module 10 has a first primary lock door 6. The first primary lock door 6 is made functionally analogous to the first lock door 5. The primary treatment module 10 can be coupled pressure-tight on the first primary lock door 6 to the pretreatment modules 9, as a result of which a modular structure and a replacement of individual modules 9, 10, 11 of the device 1 can be implemented.

By controlling the first lock door 5 and the first primary lock door 6 by means of the central control apparatus 102, the pretreatment module 9 can be used as a lock, specifically by the first lock door 5 being closed when the first lock door 6 is opened and vice versa.

The primary treatment module 10 consists of the primary treatment chamber 3 which encloses or forms a primary treatment space 13.

Opposite the first primary lock door 6 of the primary treatment chamber 3 there is a second primary lock door 7 which is included at least partially in the primary treatment chamber 3 and which is used to unload the wafer 15 from the primary treatment chamber 3 into an aftertreatment chamber 4. The second primary lock door 7 is formed at least partially by the aftertreatment chamber 4. The primary treatment space 13 can be sealed pressure-tight by the second primary lock door 7 from one aftertreatment space 14 of the aftertreatment chamber 4. Functionally the second primary lock door 7 corresponds to the first primary lock door 6, the first primary lock door 6 and the second primary lock door 7, controlled from the central control apparatus 102, forming a lock.

The aftertreatment module 11 for aftertreatment of the wafer 15 after primary treatment in the primary treatment module 10 consists of the aftertreatment chamber 4 which forms the aftertreatment space 14. Furthermore the aftertreatment chamber 4 has a second lock door 8 which is located opposite the second primary lock door 7.

The wafer 15 can be unloaded via the second lock door 8 and by means of a second robot arm 17 after aftertreatment out of the aftertreatment space 14 as soon as the second lock door 8 is opened.

The aftertreatment module 11 can likewise act as a lock by the second primary lock door 7 being closed when the second lock door 8 is opened and vice versa.

The second lock door 8 is located on a second face side 19 of the device 1 so that a linear movement of the wafer 15 takes place during the entire process sequence through the pretreatment module 9, the primary treatment module 10 and the aftertreatment module 11.

Figure 2A:
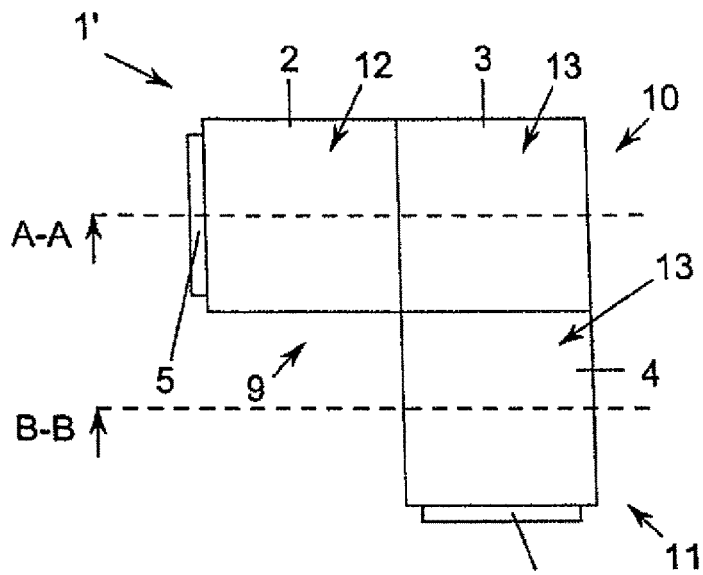
FIG. 2b shows a schematic sectional view of the device as claimed in the invention according to cutting line A-A from FIG. 2a, FIG. 2c shows a schematic sectional view of the device as claimed in the invention according to cutting line B-B from FIG. 2a, FIG. 3 shows a pressure/temperature diagram of a method as claimed in the invention for processing of substrates
Figure 2B:
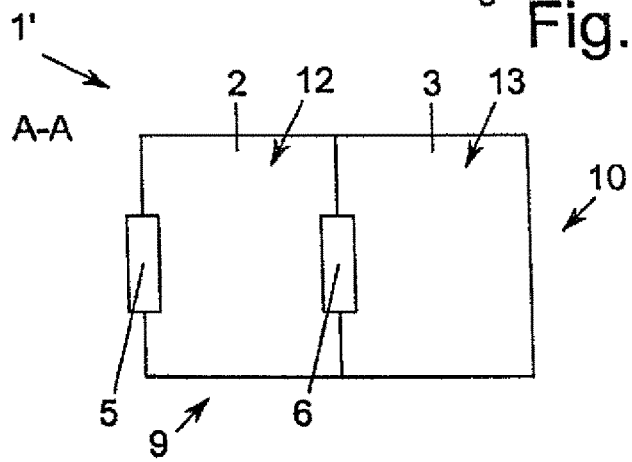
Figure 2C:
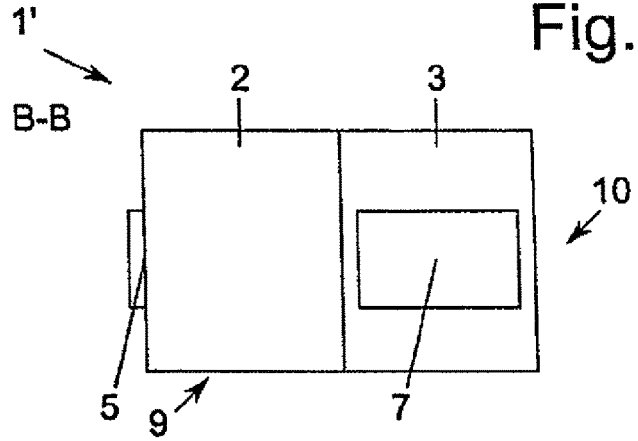

The embodiment according to FIG. 2a differs by the angular arrangement of the modules 9, 10, 11 so that an altered device 1' results. Only the configuration of the primary treatment chamber 3' is altered, since the second primary lock door 7 is not located opposite the first primary lock door 6, but on one side wall of the primary treatment chamber 3'.

In another embodiment of the invention, in the embodiment according to FIGS. 1a and 1b an additional side module (not shown) analogously to the aftertreatment module 11 in FIG. 2a can be located laterally on the primary treatment module 10 in order to remove the damaged wafers which are detected during the process flow from the process sequence.

Figure 3:
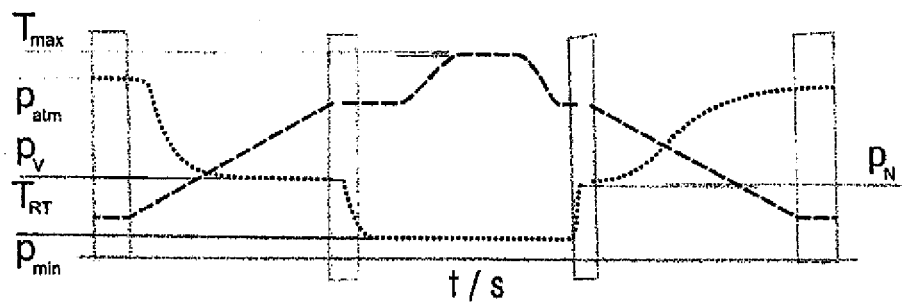

A process sequence as claimed in the invention whose pressure and temperature behavior is shown in FIG. 3 proceeds as follows:

The first primary lock door 6 and the second primary lock door 7 are closed. Afterwards the pressure in the primary treatment space 13 is lowered by a pressurization apparatus which is not shown, for example a vacuum pump, especially to a pressure $p_{min}$ less than $10^{-6}$ bar, preferably to a pressure less than $10^{-9}$ bar. This ideally takes place only a single time during the processing of a plurality, especially more than 100, preferably more than 1000, even more preferably more than 10000 wafers or wafer pairs.

Via the opened first lock door 5 a wafer 15 or wafer pair is loaded into the pretreatment chamber by means of the first robot arm 16 and is treated there. Pretreatment can be a dry and/or wet process step, for example wet cleaning, plasma treatment, etching, heating or the like. The pretreatment especially preferably comprises an especially optical and/or mechanical alignment apparatus.

Before or after or during the pretreatment step the pretreatment space 12 can be evacuated via a separately activated pressurization apparatus.

Before opening the first primary lock door 6, in any case the first lock door 5 is closed and the pretreatment space 12 is evacuated, especially to a pressure $p_V$, during or shortly prior to the loading of the pretreatment chamber 3 of less than $10^{-6}$ bar, preferably less than $10^{-7}$ bar, so that the pretreatment module 9 acts as a lock for the primary treatment module 10.

The wafer 15 is loaded by an internal transport system, for example a robot arm, through the first primary lock door 6 into the primary treatment chamber 3, 3'.

Then the first primary lock door 6 is closed. During the loading of the primary treatment chamber 3, 3' the second primary lock door 7 is continually closed. The pressure is preferably further lowered to $p_{min}$ less than $10^{-6}$ bar, even more preferably $10^{-9}$ bar.

After closing the first primary lock door 6, another wafer 15 can be loaded into the pretreatment chamber 2. At the same time the primary treatment of the first wafer 15 takes place in the primary treatment module 10. This can be for example bonding, lacquering, imprinting, embossing and/or exposure.

After the primary treatment of the wafer 15 in the primary treatment module 10, the wafer 15 is loaded into the aftertreatment module 11 by opening the second primary lock door 7, the second lock door 8 being closed. Before opening of the second primary lock door 7 the aftertreatment space 14 is exposed to a vacuum, especially a pressure $p_N$ of less than $10^{-6}$, preferably less than $10^{-7}$ by a pressurization apparatus of the aftertreatment module 11 at least until the wafer 15 is loaded from the primary treatment module 10 into the aftertreatment module 11 and the second primary lock door 7 is closed again.

Then aftertreatment of the wafer 15 takes place in the aftertreatment module 11, for example cooling and simultaneous raising of the pressure by the pressurization apparatus of the aftertreatment module 11.

After completion of the aftertreatment of the wafer 15 in the aftertreatment module 11, the wafer 15 is removed via the second lock door 8 and the second robot arm 17.

Before each opening of the primary lock door 6 the pretreatment chamber 2, and before each opening of the primary lock door 7 the aftertreatment chamber 4 are exposed to a pressure $p_V$ or $p_N$ less than the atmospheric and/or ambient pressure $P_{ATM}$ outside the chambers 2, 3, 4 and/or decontaminated, especially flushed with inert gas.

According to one especially advantageous embodiment of the above described invention, the wafer 15 is a wafer pair and a wafer pair is loaded into the device 1 in the above described manner by means of a holding device or handling apparatus for handling of the wafer pair, the pretreatment shown in the left-hand section in FIG. 3 comprising the steps heating, evacuation, gas flushing with reducing gas, a wet chemical treatment, a plasma treatment and/or argon bombardment.

The primary treatment takes place in a vacuum which is higher compared to pretreatment, therefore at a lower pressure $p_{min}$ as is shown in FIG. 3 in the middle section. A controlled gas atmosphere, therefore an exactly set gas pressure and an exactly controlled mixing ratio of gases are set by the pressurization apparatus of the primary treatment module 10. Then the wafer pair is brought into contact and bonded. Beforehand, the temperature which is necessary for the joining, especially $T_{max}$, is set to be greater than 250° C., preferably $T_{max}$ greater than 400° C. During bonding, a force as uniform as possible is applied to the wafer pair and/or an electrical voltage is applied.

The aftertreatment which is shown in FIG. 3 in the right-hand section, takes place in an nonoxidizing environment, in which cooling takes place and the pressure is raised to atmospheric pressure. Slow cooling prevents or avoids thermal stresses in the wafer pair which was bonded beforehand.

Figure 5:
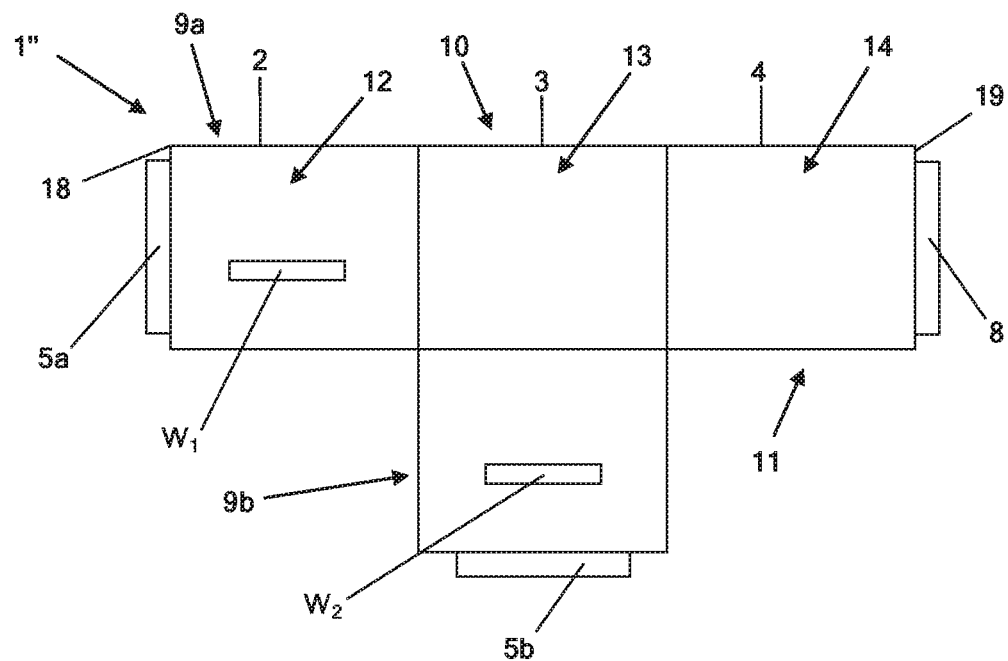
FIG. 5 shows a schematic plan view of an alternative embodiment of the device illustrated in FIG. 1a, wherein the device includes two pretreatment modules for respective pretreatment of first and second wafers or first and second wafer pairs.

The pretreatment of the wafer pair can take place according to an embodiment shown in FIG. 5. Device 1" includes a first pretreatment module 9a for pretreatment of the first wafer $W_1$ or wafer pair and a second pretreatment module 9b for pretreatment of the second wafer $W_2$ or wafer pair. The first and the second wafers $W_1$, $W_2$ can be loaded into the primary treatment chamber via separate lock doors.

The chambers 2, 3, 4 are preferably made of stainless steel or aluminum.

In the embodiment shown in FIG. 4, the first lock door 5 is not located on the face side 18 of the pretreatment chamber 2', but on the side wall. The second lock door 8 is not located on the face side 19, but on the side wall of the aftertreatment chamber 4'.

The process flow is shown by arrows in FIG. 4.

The primary lock doors 6, 7 must accordingly have high pressure tightness up to $p_{min}$ and are preferably made as a transfer valve which is or can be inserted in a common channel between the respectively adjacent chambers 2, 3, 4, forming a seal. The opening diameter of the lock doors 5, 6, 7, 8 is more than 200 min, especially more than 300 mm, preferably more than 450 mm.

REFERENCE NUMBER LIST

1, 1', 1'' device
2, 2' pretreatment chamber
3, 3' primary treatment chamber
4, 4' aftertreatment chamber
5 first lock door
6 first primary lock door
7 second primary lock door
8 second lock door
9 pretreatment module
10 primary treatment module
11 aftertreatment module
12 pretreatment space
13 primary treatment space
14 aftertreatment space
15 wafer
16 first robot arm
17 second robot arm
18 first face side
19 second face side
20 temperature exposure apparatus
102 central control apparatus Having described the invention, the following is claimed:

1. A device for processing substrates, the device comprising:
    a pretreatment module having a pretreatment chamber which forms a pretreatment space;
    an aftertreatment module having an aftertreatment chamber which forms an aftertreatment space;
    a primary treatment module having a primary treatment chamber which forms a primary treatment space, said primary treatment module coupled to the pretreatment module and the aftertreatment module, wherein a first substrate is bonded to a second substrate within the primary treatment space by bringing the first and second substrates into contact with each other, said primary treatment module including a heating apparatus for heating the primary treatment space to a temperature necessary for bonding the first and second substrates, said temperature being greater than 250° C.;
    a first primary lock door located between the primary treatment space and the pretreatment space, said first primary lock door movable between an open state and a closed state, said first primary lock door providing a vacuum-tight lock between the primary treatment module and the pretreatment module in the closed state; and
    a second primary lock door located between the primary treatment space and the aftertreatment space, said second primary lock door movable between an open state and a closed state, said second primary lock door providing a vacuum-tight lock between the primary treatment module and the aftertreatment module in the closed state.

2. The device according to claim 1, wherein the first primary lock door located between the primary treatment chamber and the pretreatment chamber is moved to the closed position during loading of the substrates into the pretreatment chamber.

3. The device according to claim 1, wherein the device further comprises:
    a temperature exposure apparatus for heating or cooling of the pretreatment space, the primary treatment space, and/or the aftertreatment space.

4. The device according to claim 1, wherein the device includes one or more additional pretreatment modules connected upstream of said pretreatment module as locks and/or one or more additional aftertreatment modules connected downstream of said aftertreatment module as locks.

5. The device according to claim 1, wherein said first and second primary lock doors provide a pressure lock and/or a temperature lock.

6. The device according to claim 1, wherein the device further comprises:
    a loading and unloading apparatus for loading and unloading of the substrates into/from the pretreatment space of the pretreatment module and/or the aftertreatment space of the aftertreatment module.

7. The device according to claim 3, wherein the temperature exposure apparatus independently heats or cools the pretreatment space and/or the primary treatment space and/or the aftertreatment space.

8. The device according to claim 6, wherein the loading and unloading apparatus includes at least one robot arm.

9. The device according to claim 1, wherein the second primary lock door located between the primary treatment chamber and the aftertreatment chamber is moved to the closed position during unloading of the substrates from the aftertreatment chamber.

10. The device according to claim 1, wherein the pretreatment module wet cleans, plasma treats, etches, and/or heats the substrates within the pretreatment space.

11. The device according to claim 1, wherein the device further comprises:
    a central control apparatus for controlling movement of said first and second primary lock doors, between the open state and the closed state.

12. The device according to claim 1, wherein the device further comprises:
    a central control apparatus for controlling the temperature exposure apparatus to heat or cool at least one of the pretreatment space, the primary treatment space, and the aftertreatment space.

13. The device according to claim 1, wherein the primary treatment module is a bonding module.

14. A device for processing substrates, the device comprising:
    a first pretreatment module having a pretreatment chamber which forms a pretreatment space for pretreatment of a first substrate;
    a second pretreatment module having a pretreatment chamber which forms a pretreatment space for pretreatment of a second substrate;
    an aftertreatment module having an aftertreatment chamber which forms an aftertreatment space;
    a primary treatment module having a primary treatment chamber which forms a primary treatment space, the primary treatment module coupled to the first and second pretreatment modules and the aftertreatment module, said primary treatment module respectively receiving the first and second substrates from the first and second pretreatment modules, wherein a first substrate is bonded to a second substrate within the primary treatment space by bringing the first and second substrates into contact with each other, said primary treatment module including a heating apparatus for heating the primary treatment space to a temperature necessary for bonding the first and second substrates, said temperature being greater than 250° C.;
a first primary lock door located between the primary treatment space and the first pretreatment space, said first primary lock door movable between an open state and a closed state, said first primary lock door providing a vacuum-tight lock between the primary treatment module and the first pretreatment module in the closed state;
a second primary lock door located between the primary treatment space and the second pretreatment space, said second primary lock door movable between an open state and a closed state, said second primary lock door providing a vacuum-tight lock between the primary treatment module and the second pretreatment module in the closed state
a second primary lock door located between the primary treatment space and the aftertreatment space, said second primary lock door movable between an open state and a closed state, said second primary lock door providing a vacuum-tight lock between the primary treatment module and the aftertreatment module in the closed state.

15. A device for processing substrates, the device comprising:
a pretreatment module having a pretreatment chamber which forms a pretreatment space;
an aftertreatment module having an aftertreatment chamber which forms an aftertreatment space, the aftertreatment chamber being a non-oxidizing environment, wherein substrates are cooled and exposed to atmospheric pressure in the aftertreatment space;
a primary treatment module having a primary treatment chamber which forms a primary treatment space, said primary treatment module coupled to the pretreatment module and the aftertreatment module, wherein a first substrate is bonded to a second substrate within the primary treatment space by bringing the first and second substrates into contact with each other, said primary treatment module including a heating apparatus for heating the primary treatment space to a temperature necessary for bonding the first and second substrates, said temperature being greater than 250° C.;
a first primary lock door located between the primary treatment space and the pretreatment space, said first primary lock door movable between an open state and a closed state, said first primary lock door providing a vacuum-tight lock between the primary treatment module and the pretreatment module in the closed state; and
a second primary lock door located between the primary treatment space and the aftertreatment space, said second primary lock door movable between an open state and a closed state, said second primary lock door providing a vacuum-tight lock between the primary treatment module and the aftertreatment module in the closed state.

* * * * *